(12) United States Patent
Yu (10) Patent No.: US 6,420,981 B1
(45) Date of Patent: Jul. 16, 2002

(54) OVERSAMPLING CIRCUIT AND METHOD

(75) Inventor: Shih-ming Yu, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/055,158

(22) Filed: Oct. 22, 2001

(30) Foreign Application Priority Data

Jul. 13, 2001 (TW) ........................................ 90117175 A (51) Int. Cl.$^7$ ................................................ H03M 9/00
(52) U.S. Cl. .................. 341/100; 326/113; 327/415; 327/416; 341/79; 341/100; 341/101
(58) Field of Search ................................. 341/100, 101, 341/110, 159, 79; 327/415, 416; 326/113

(56) References Cited

U.S. PATENT DOCUMENTS

| | | | | |
|---|---|---|---|---|
| 3,885,167 A | * | 5/1975 | Berglund ...................... | 377/57 |
| 5,218,363 A | * | 6/1993 | LeCroy et al. ............... | 341/123 |
| 5,257,025 A | * | 10/1993 | LeCroy, Jr. .................. | 341/100 |

* cited by examiner

Primary Examiner—Michael Tokar
Assistant Examiner—Linh Van Nguyen
(74) Attorney, Agent, or Firm—J.C. Patents (57) ABSTRACT

An oversampling circuit and method is proposed, which is used for converting an input serial data stream into a parallel data format. The proposed oversampling circuit comprises an array of transmission gates arranged into N cascaded stages of main sampling circuits, each stage of main sampling circuit being composed of M parallel layers of sub-sampling circuits, where N, M are each an integer number; each transmission gate has an input end, an output end, and a control port; and the respective control ports of all the transmission gates are connected to a predefined sequence of sampling pulses. The proposed oversampling circuit is characterized in that in the next stage of main sampling circuits, at least one of the transmission gates in one layer of sub-sampling circuit has its output end connected to one of the transmission gates in the next layer of sub-sampling circuit; and at least one of the transmission gates in the last layer of sub-sampling circuit has its output end connected to one of the transmission gates in the first layer of sub-sampling circuit. This arrangement can help reduce the number of fan-outs and allows a greater error margin that allows the pulse generation and sequencing to be easier to realize than the prior art.

13 Claims, 7 Drawing Sheets

OVERSAMPLING CIRCUIT AND METHOD

CROSS-REFERENCE TO RELATED APPLICATION

This application claims the priority benefit of Taiwan application serial no. 90117175, filed Jul. 13, 2001.

BACKGROUND OF THE INVENTION

1. Field of the Invention:

This invention relates to signal processing technology, and more particularly, to an oversampling circuit and method.

2. Description of Related Art:

Serial link technology is utilized in communications systems, can offer a data transmission rate up to one billion bits per second and is also low cost to implement. Due to these benefits, the serial link technology is widely used in radio transceivers, computer-to-computer communication, and computer-to-peripheral communication.

Figure 1:
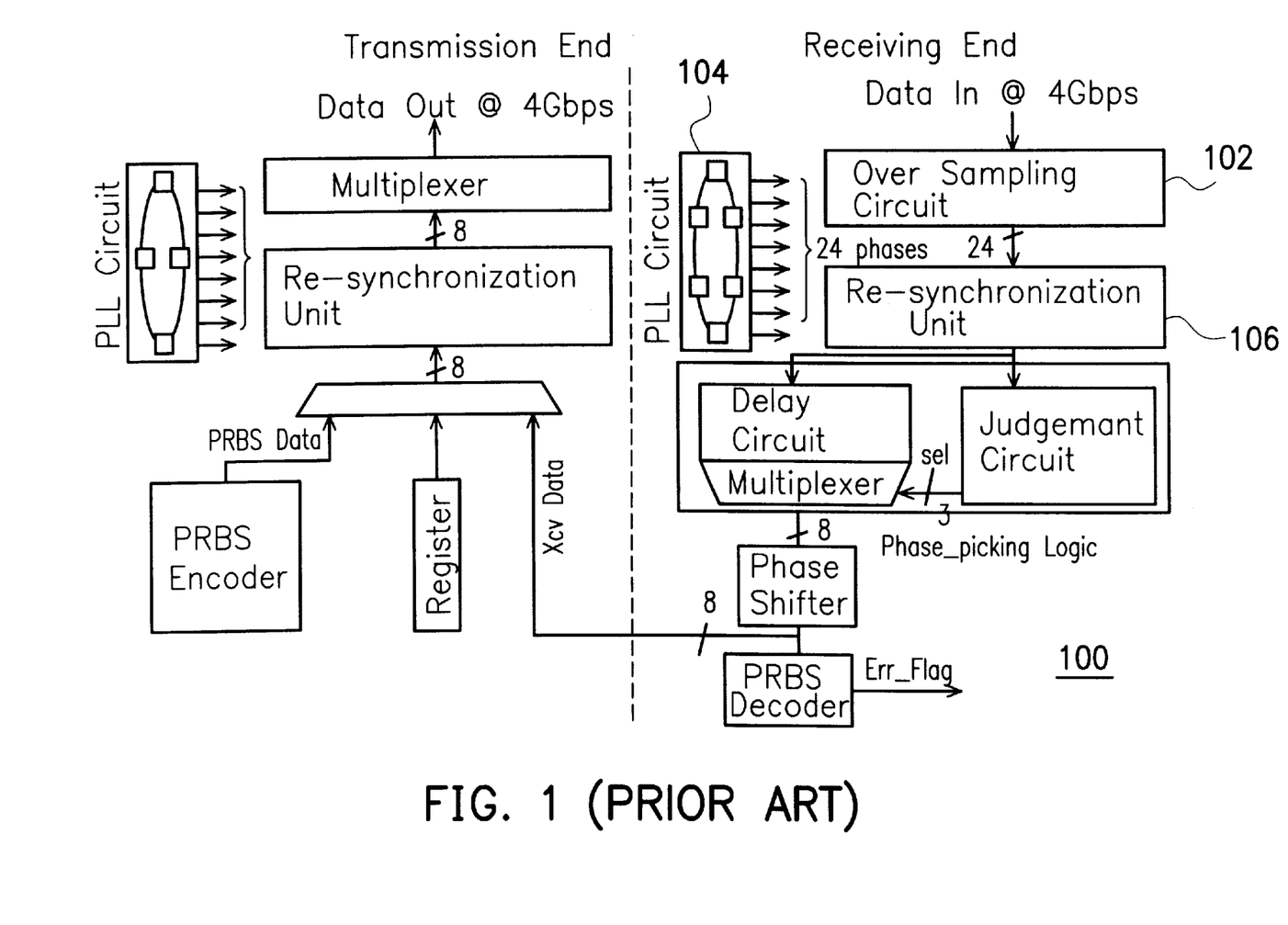
FIG. 1 (PRIOR ART) is a schematic block diagram showing a conventional transceiver which utilizes serial link technology.

FIG. 1 shows a conventional transceiver which utilizes serial link technology (for details, please refer to IEEE JOURNAL OF SOLID-STATE CIRCUITS, VOL. 33, NO. MAY 5, 1988, "A 0.5 $\mu$m CMOS 4.0-Gbit/s Serial Link Transceiver with Data Recovery (Using Oversampling", Chih-Kong Ken Yan, Ramin Farjad-Rad, Mark A. Horowitz). As shown, the transceiver 100 includes an oversampling circuit 102 whose input end (Data In) is used to receive a 4-Gbps serial data stream, and which is capable of converting the serial data into 8-bit parallel format. In order to obtain the correct transition of each bit, the oversampling circuit 102 utilizes a sampling rate three times the bit rate of the input data. Therefore, the PLL (phase-locked loop) circuit 104 should output 24 sampling pulses to the oversampling circuit 102 for each output byte.

Figure 2:
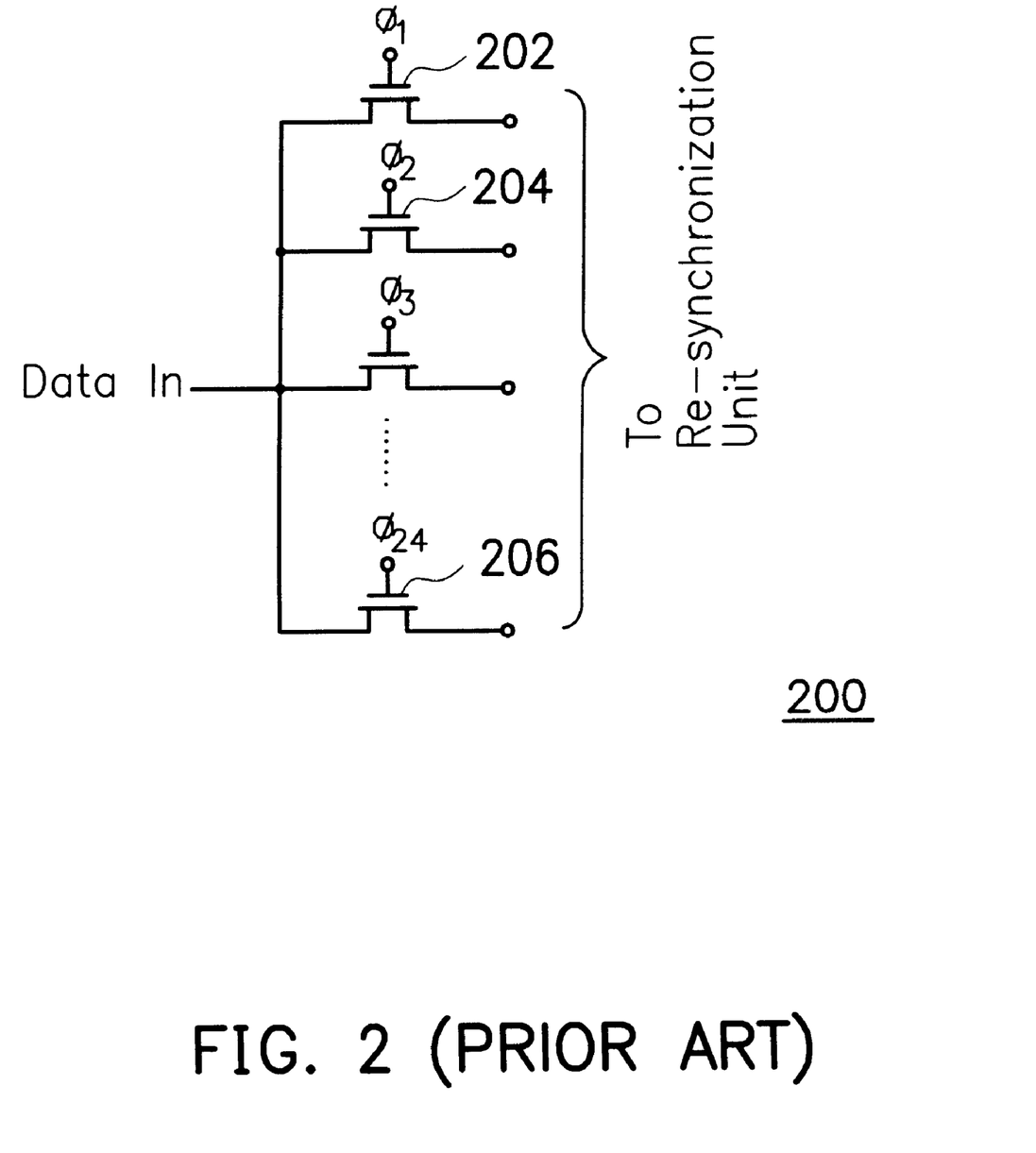
FIG. 2 (PRIOR ART) is a schematic diagram showing the circuit architecture of a conventional oversampling circuit.

FIG. 2 shows a conventional oversampling circuit 200 (which can be used to serve as the oversampling circuit 102 shown in FIG. 1). As shown, this oversampling circuit 200 includes 24 MOSFETs, each MOSFET has a gate connected to the PLL circuit 104 shown in FIG. 1 to receive one of the 24 output sampling pulses from the PLL circuit 104; i.e., the first MOSFET 202 has its gate connected to receive the first sampling pulse $\Phi_1$ from the PLL circuit 104; the second MOSFET 204 has its gate connected to receive the second sampling pulse $\Phi_2$; and so forth the last MOSFET 206 having its gate connected to receive the 24th sampling pulse $\Phi_{24}$.

Referring back to FIG. 1, since the input end (Data In) of the oversampling circuit 102 receives a 4-Gbps serial data stream, the period of each bit is 250 ps (picosecond). Therefore, the use of the triple sampling rate would result in a phase difference $\Delta t$ as follows:

$$\Delta t = 250/3 = 83 \, ps$$

Figure 3:
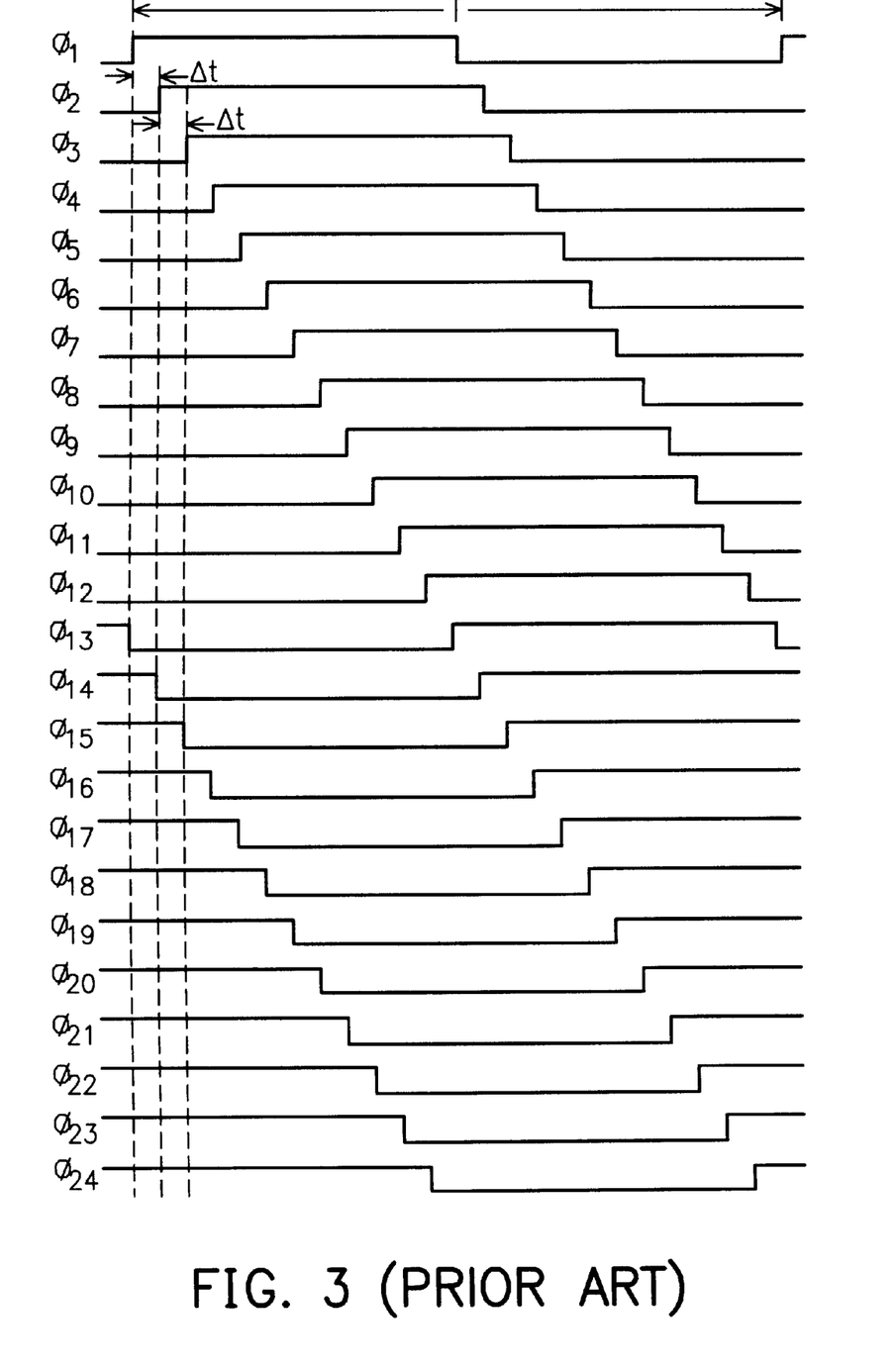
FIG. 3 (PRIOR ART) is a waveform diagram showing the timing between a sequence of sampling pulses utilized by conventional oversampling circuit of FIG. 2.

The pulse sequencing diagram of the sampling pulses ($\Phi_1 \sim \Phi_{24}$ is shown in FIG. 3. The period T of each of the sampling pulses $\Phi_1 \sim \Phi_{24}$ is 250 ps, and the phase difference between two successive sampling pulses is $\Delta t$=83 ps. These 24 sampling pulses $\Phi_1 \sim \Phi_{24}$ are used for the sampling of one byte of data; wherein the first three sampling pulses $\Phi_1 \sim \Phi_3$ are used for the sampling of the first bit in the byte, the second three sampling pulses $\Phi_4 \sim \Phi_6$ are used for the sampling of the second bit in the byte, and so forth the last three sampling pulses $\Phi_{22} \sim \Phi_{24}$ being used for the sampling of the eighth bit in the byte.

Therefore, one byte of data is generated for each cycle of the 24 sampling pulses $\Phi_1 \sim \Phi_{24}$.

Each cycle of the 24 sampling pulses $\Phi_1 \sim \Phi_{24}$ will respectively cause the 24 transmission gates of the MOSFETs in the oversampling circuit 200 of FIG. 2 to be switched ON. In this case, the fan-out loading of the oversampling circuit 200 is the loading of the 24 transmission gates. If the sampling rate is five times the bit rate, the oversampling circuit then needs 40 transmission gates; and in this case, the fan-out loading is the loading of the 40 transmission gates. Fundamentally, a larger sampling rate will require a larger fan-out loading. However, an overly large fan-out loading would cause the oversampling circuit to lose its fan-out capability.

Figure 4:
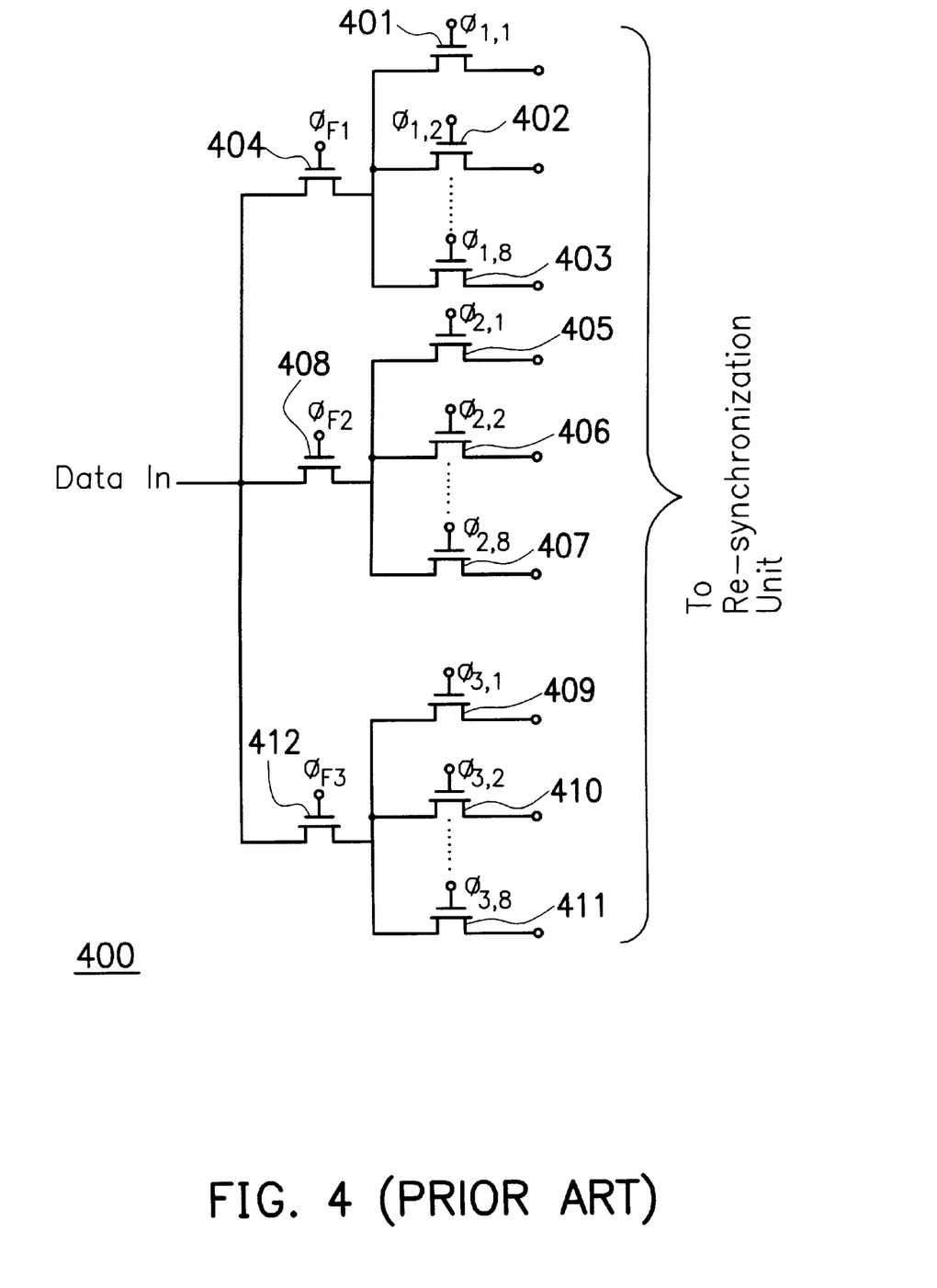
FIG. 4 (PRIOR ART) is a schematic diagram showing the circuit architecture of another conventional oversampling circuit.

One solution to the foregoing problem is to use a multistage oversampling circuit 400 shown in FIG. 4, which needs 27 sampling pulses rather than 24 for each cycle of byte. As shown, these 27 sampling pulses are denoted by ($\Phi_{1,1} \sim \Phi_{1,8}$, $\Phi_{2,1} \sim \Phi_{2,8}$, $\Phi_{3,1} \sim \Phi_{3,8}$, $\Phi_{F1} \sim \Phi_{F3}$); wherein $\Phi_{1,1} \sim \Phi_{1,8}$ are applied to the respective gates of 8 MOSFETs (401, 402, . . . , 403); $\Phi_{2,1} \sim \Phi_{2,8}$ are applied to the respective gates of 8 MOSFETs (405, 406, . . . , 407); $\Phi_{3,1} \sim \Phi_{3,8}$ are applied to the respective gates of 8 MOSFETs (409, 410, . . . , 411); and $\Phi_{F1} \sim \Phi_{F3}$ are applied to the respective gates of 3 MOSFETs (404, 408, . . . , 412). This requires the PLL circuit 104 to generate 27 sampling pulses.

Figure 5:
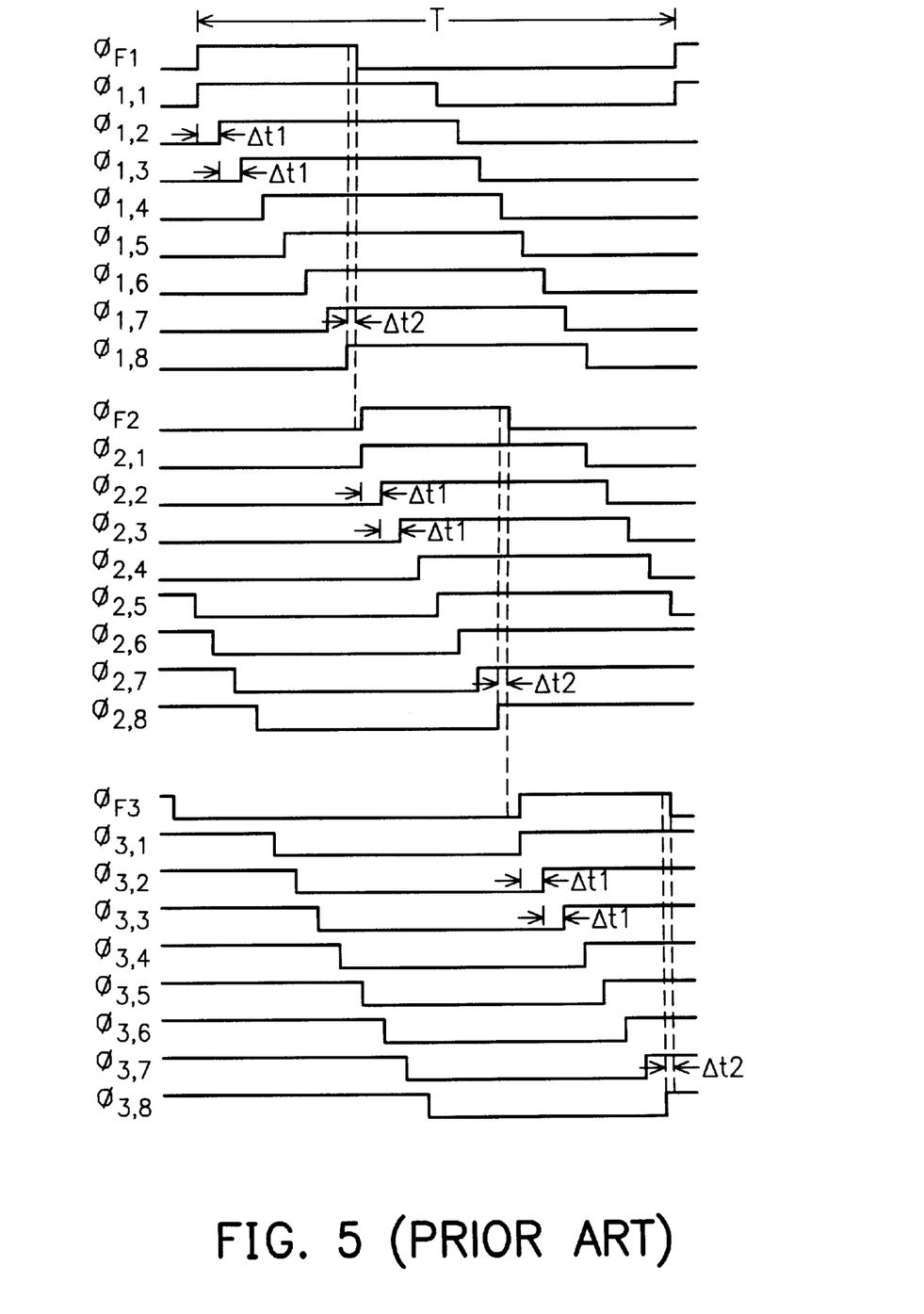
FIG. 5 (PRIOR ART) is a waveform diagram showing the timing between a sequence of sampling pulses utilized by conventional oversampling circuit of FIG. 4.

FIG. 5 shows the pulse sequencing diagram of the 27 sampling pulses $\Phi_{1,1} \sim \Phi_{1,8}$, $\Phi_{2,1} \sim \Phi_{2,8}$, $\Phi_{3,1} \sim \Phi_{3,8}$ and $\Phi_{F1} \sim \Phi_{F3}$. As shown, the period T of each of the 27 sampling pulses is T=250 ps, and the phase difference between two successive pulses in $\Phi_{1,1} \sim \Phi_{1,8}$, $\Phi_{2,1} \sim \Phi_{2,8}$ and $\Phi_{3,1} \sim \Phi_{3,8}$ is $\Delta t_1$=83 ps. The sampling pulse $\Phi_{F1}$ appears at logic-HIGH state for a period of $7*\Delta t_1 + \Delta t_2$, which causes the MOSFET 404 to be switched ON. Then, the 8 MOSFETs (401, 402, . . . , 403) are successively switched ON by $\Phi_{1,1} \sim \Phi_{1,8}$, allowing them to sample the input serial data. The sampling pulse $\Phi_{F1}$ is switched from logic-HIGH back to logic-LOW by a time lag of $\Delta t_2$ after the transition of the last sampling pulse $\Phi_{1,8}$ from logic-LOW to logic-HIGH. This can help ensure that the last MOSFET 403 has been switched ON when the MOSFET 404 is switched OFF.

After $\Phi_{F1}$ has been switched from logic-HIGH to logic-LOW, $\Phi_{F2}$ must be switched from logic-LOW to logic-HIGH at an earlier time than or at the same time as $\Phi_{2,1}$. This can help prevent the condition of the MOSFET 405 being switched ON while the MOSFET 408 is still in OFF state. Otherwise, it would cause loss of data at the MOSFET 405. Therefore, $\Phi_{F2}$ should remain at logic-HIGH for a period of $7*\Delta t_1 + \Delta t_2$ (the same as $\Phi_{F1}$).

When the sampling pulse $\Phi_{F2}$ appears at logic-HIGH, it causes the MOSFET 408 shown in FIG. 3 to be switched ON. Then, the 8 MOSFETs (405, 406, . . . , 407) are successively switched ON by $\Phi_{2,1} \sim \Phi_{2,8}$ allowing them to sample the input serial data. The sampling pulse $\Phi_{F2}$ is switched from logic-HIGH back to logic-LOW by a time lag of $\Delta t_2$ ($\Delta t_2 < \Delta t_1$) after the transition of the last sampling pulse $\Phi_{2,8}$ from logic-LOW to logic-HIGH. This can help ensure that the last MOSFET 407 has been switched ON when the MOSFET 408 is switched OFF.

The operations of the sampling pulses ($\Phi_{3,1} \sim \Phi_{3,8}$, $\Phi_{F3}$) are similar to the operations of ($\Phi_{1,1} \sim \Phi_{1,8}$, $\Phi_{F1}$) and ($\Phi_{2,1} \sim \Phi 2_{2,8}$, $\Phi_{F2}$), so description thereof will not be repeated.

The forgoing multi-stage oversampling circuit 400 shown in FIG. 4 can solve the earlier-mentioned fan-out problem of the conventional oversampling circuit by providing an additional stage of MOSFET circuit, i.e., the three MOSFETs 404, 408, 412. This first stage of MOSFET circuit (404, 408, 412) can separate the input end (Data In) from the second stage of MOSFET circuit [(401, 402, . . . , 403), (405, 406, . . . , 407), (409, 410, . . . , 411)], thus allowing the outputs of the first stage of MOSFET circuit to be directly fan-out to the output loading of the second stage of MOSFET circuit.

One drawback to the forgoing multi-stage oversampling circuit 400 shown in FIG. 4, however, is that the timing for the sampling pulse used to switch the first stage of MOSFET circuit and the second stage of MOSFET circuit should be highly precisely controlled; otherwise, if any of the MOSFET in the first stage slightly lag behind, it would undesirably cause loss of data at the second stage of MOSFET circuit. This timing control, however, is quite difficult to achieve, and thus the probability of data loss is high.

SUMMARY OF THE INVENTION

It is therefore an objective of this invention to provide a new oversampling circuit and method, which can reduce the number of fan-outs at the output loading of the transmission gate circuit, and which allows a larger error margin in the timing of the sampling pulses.

The oversampling circuit according to the invention comprises an array of transmission gates arranged into N cascaded stages of main sampling circuits, each stage of main sampling circuit being composed of M parallel layers of sub-sampling circuits, where N, M are each an integer number; each transmission gate has an input end, an output end, and a control port; and the respective control ports of all the transmission gates are connected to a predefined sequence of sampling pulses; wherein the transmission gates in the first stage of main sampling circuit are arranged in parallel and whose input ends are connected to receive the input serial data stream and whose output ends are each cascaded to one sub-sampling circuit in the next stage which is composed of a plurality of transmission gates arranged in parallel in a number equal to the number of bits in the parallel data format and whose input ends are connected together to the output end of the transmission gate in the previous stage of main sampling circuit; and wherein in the next stage of main sampling circuits, at least one of the transmission gates in one layer of sub-sampling circuit has its output end connected to one of the transmission gates in the next layer of sub-sampling circuit; and at least one of the transmission gates in the last layer of sub-sampling circuit has its output end connected to one of the transmission gates in the first layer of sub-sampling circuit.

The oversampling method according to the invention is used on an oversampling circuit composed of an array of transmission gates arranged into N cascaded stages of main sampling circuits, each stage of main sampling circuit being composed of M parallel layers of sub-sampling circuits, where N, M are each an integer number; each transmission gate has an input end, an output end, and a control port. The oversampling method of the invention comprises the steps of: arranging the transmission gates in the first stage of main sampling circuit in parallel and whose input ends are connected to receive the input serial data stream and whose output ends are each connected to one sub-sampling circuit in the next stage which is composed of a plurality of transmission gates arranged in parallel in a number equal to the number of bits in the parallel data format and whose input ends are connected together to the output end of the transmission gate in the previous stage of main sampling circuit; connecting at least one of the output ends of the transmission gates in one layer of sub-sampling circuit to one of the output ends of the transmission gates in the next layer of sub-sampling circuit; and connecting at least one of the output ends of the transmission gates in the last layer of sub-sampling circuit to one of the output ends of the transmission gates in the first layer of sub-sampling circuit, applying a predefined sequence of sampling pulses to the respective control ports of the transmission gates in each stage of main sampling circuit; and as one of the transmission gates in each stage of main sampling circuit is switched ON, applying a predefined sequence of sub-sampling pulses to the respective control ports of the transmission gates in the cascaded sub-sampling circuit.

The oversampling circuit and method of the invention can help reduce the number of fan-outs. Moreover, the invention allows a greater error margin that allows the pulse generation and sequencing to be easier to realize than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The oversampling circuit and method according to the invention is disclosed in full details by way of preferred embodiment in the following with reference to FIG. 6 and FIG. 7.

Fundamentally, the oversampling circuit according to the invention is based on a multi-stage circuit architecture composed of N cascaded stages of main sampling circuits, each stage of main sampling circuit being composed of M parallel layers of sub-sampling circuits, and each sub-sampling circuit including at least P MOSFETs whose output ends are interconnected, where N, M and P are integer numbers and $N \geq 2$, $M \geq 2$, and $P \geq 1$.

Figure 6:
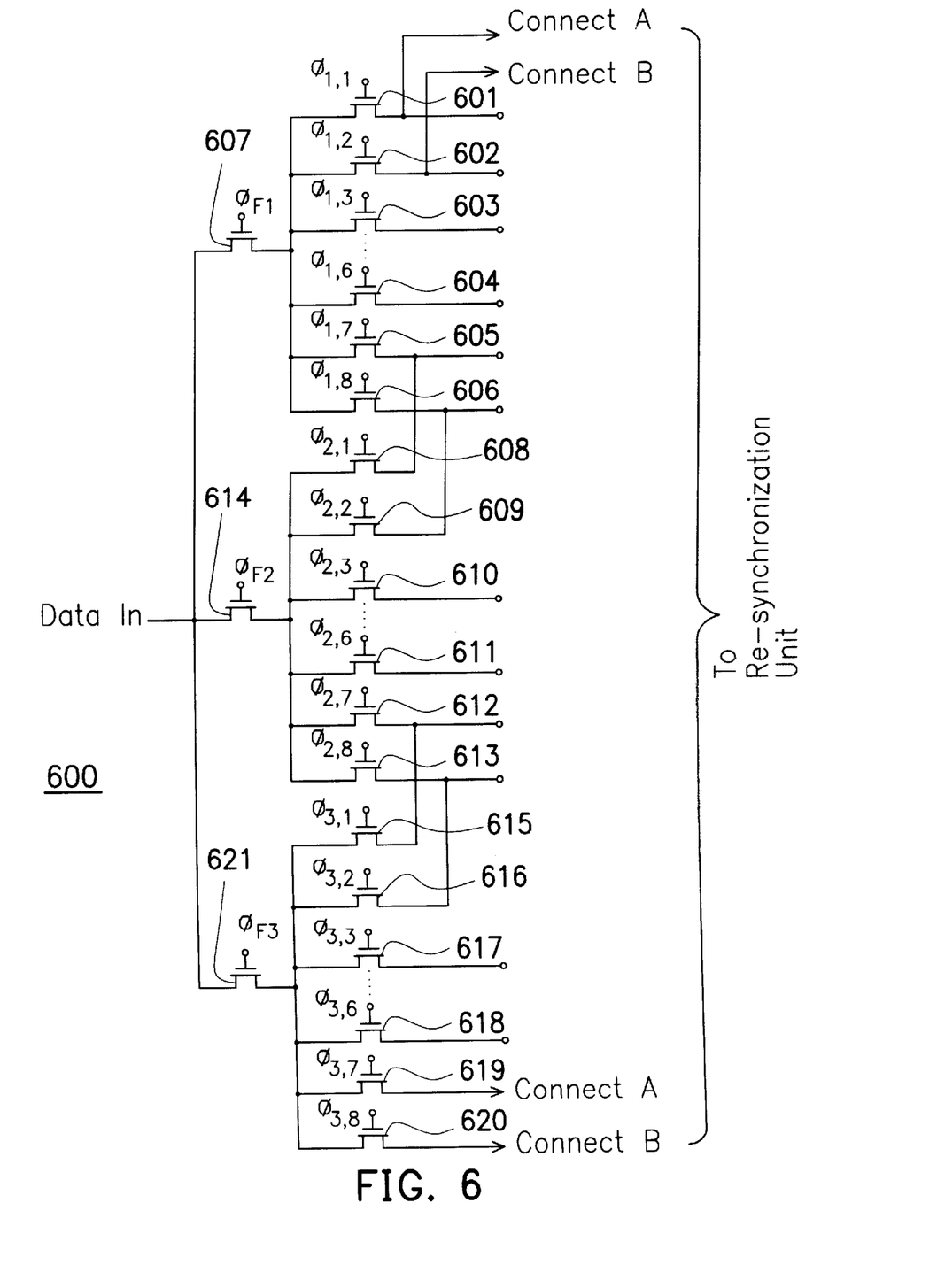
FIG. 6 is a circuit diagram showing a preferred embodiment of the oversampling circuit according to the invention.

FIG. 6 is a circuit diagram showing a preferred embodiment of the oversampling circuit according to the invention. In the preferred embodiment of FIG. 6, for example, the oversampling circuit 600 is based on N=2, M=2, and P=2, and the sampling rate is three times the bit rate of the input serial data. As shown, the first stage of main sampling circuit is composed of 3 MOSFETs (607, 614, 621), whose input ends are tied together to the serial data input port (Data In), and whose output ends are respectively coupled to one sub-sampling circuit in the second stage of main sampling circuit, each sub-sampling circuit being composed of 8

MOSFETs; i.e., the first sub-sampling circuit coupled to the MOSFET 607 is composed of 8 MOSFETs (601, 602, 603, . . . , 604, 605, 606), the second sub-sampling circuit coupled to the MOSFET 614 is composed of 8 MOSFETs (608, 609, 610, . . . , 611, 612, 613); and the third sub-sampling circuit coupled to the MOSFET 621 is composed of 8 MOSFETs (615, 616, 617, . . . , 618, 619, 620). The respective input ends of the 8 MOSFETs (601, 602, 603, . . . , 604, 605, 606) are tied together and connected to the output end of the MOSFET 607; the respective input ends of the 8 MOSFETs (608, 609, 610, . . . , 611, 612, 613) are tied together and connected to the output end of the MOSFET 614; and the respective input ends of the 8 MOSFETs (615, 616, 617, . . . , 618, 619, 620) are tied together and connected to the output end of the MOSFET 621. Further, the respective output ends of the 24 MOSFETs (601, 602, 603, . . . , 604, 605, 606), (608, 609, 610, . . . , 611, 612, 613), and (615, 616, 617, . . . , 618, 619, 620) are coupled to a re-synchronization unit (as the re-synchronization unit 106 shown in FIG. 1).

Further, as illustrated in FIG. 6, the output end of the first MOSFET 601 is connected to the output end of the seventh MOSFET 619; the output end of the second MOSFET 602 is connected to the last MOSFET 620; the output end of the seventh MOSFET 605 is connected to the output end of the first MOSFET 608; the output end of the eight MOSFET 606 is connected to the output end of the second MOSFET 609; the output end of the seventh MOSFET 612 is connected to the output end of the first MOSFET 615; and the output end of the eighth MOSFET 613 is connected to the output end of the second MOSFET 616.

A PLL circuit (as the PLL circuit 104 shown in FIG. 1) is used to supply a sequence of 27 sampling pulses ($\Phi_{F1}$~$\Phi_{F3}$, $\Phi_{1,1}$~$\Phi_{1,8}$, $\Phi_{2,1}$~$\Phi_{2,8}$, $\Phi_{3,1}$~$\Phi_{3,8}$) to the oversampling circuit 600, wherein $\Phi_{F1}$ is supplied to the gate of the MOSFET 607, $\Phi_{F2}$ is supplied to the gate of the MOSFET 614, $\Phi_{F3}$ is supplied to the gate of the MOSFET 621; and wherein $\Phi_{1,1}$ is identical to $\Phi_{3,7}$, $\Phi_{1,2}$ is identical to $\Phi_{3,8}$, $\Phi_{1,7}$ is identical to $\Phi_{2,1}$, $\Phi_{1,8}$ is identical to $\Phi_{2,2}$, $\Phi_{2,7}$ is identical to $\Phi_{3,1}$, and $\Phi_{2,8}$ is identical to $\Phi_{3,2}$.

Figure 7:
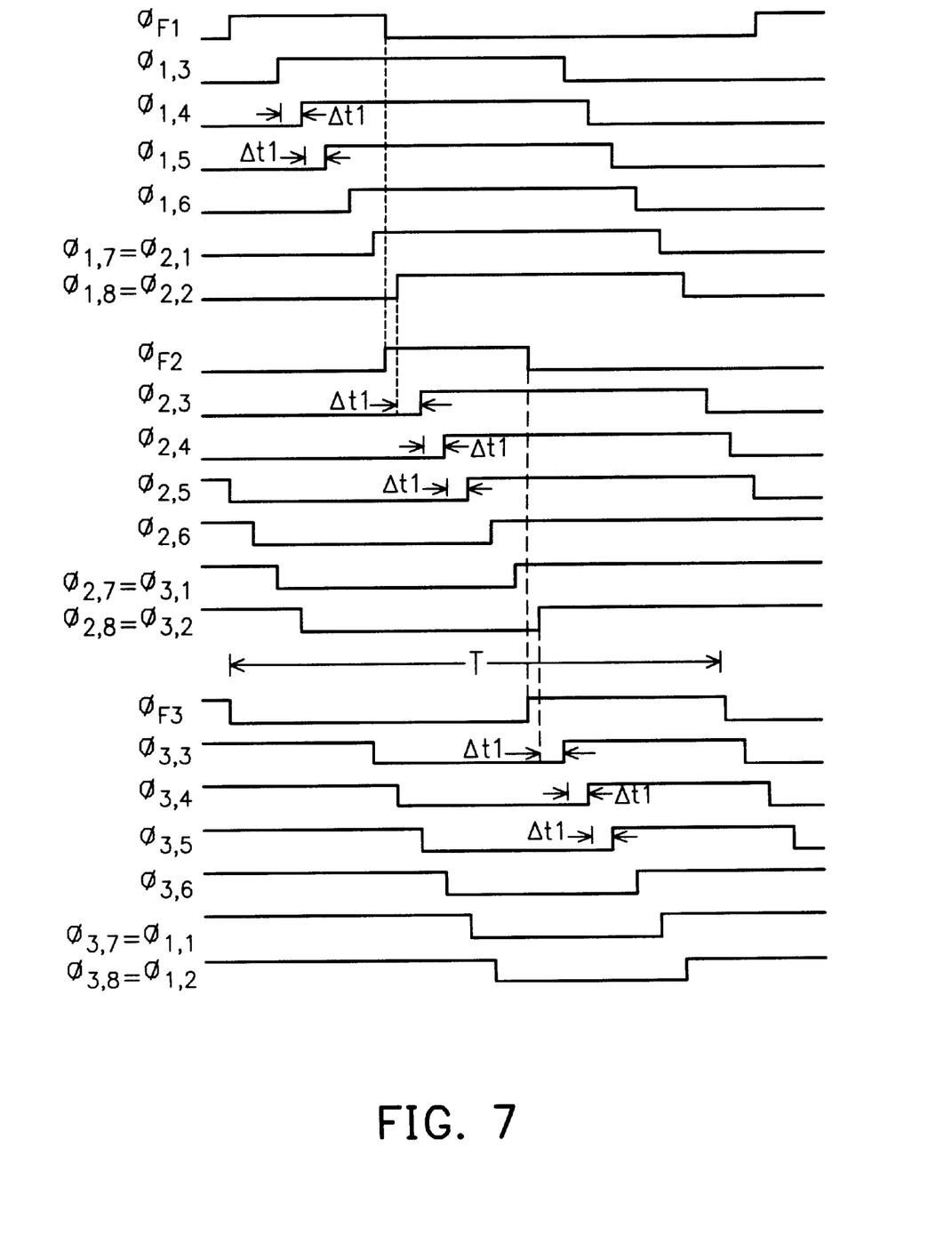
FIG. 7 is a waveform diagram showing the timing between a sequence of sampling pulses utilized by the oversampling circuit according to the invention.

FIG. 7 shows the pulse sequencing diagram of the 27 sampling pulses ($\Phi_{F1}$~$\Phi_{F3}$, $\Phi_{1,1}$~$\Phi_{1,8}$, $\Phi_{2,1}$~$\Phi_{2,8}$, $\Phi_{3,1}$~$\Phi_{3,8}$). The period of T of each of the sampling pulses $\Phi_{F1}$~$\Phi_{F3}$, $\Phi_{1,1}$~$\Phi_{1,8}$, $\Phi_{2,1}$~$\Phi_{2,8}$, $\Phi_{3,1}$~$\Phi_{3,8}$) is T=250 ps. The phase difference between two successive sampling pulses in ($\Phi_{1,3}$~$\Phi_{1,8}$, $\Phi_{2,3}$~$\Phi_{2,8}$, $\Phi_{3,3}$~$\Phi_{3,8}$) is $\Delta t_1$=83 ps the phase difference between $\Phi_{1,8}$ and $\Phi_{2,3}$ is 3*$\Delta t_1$; the phase difference between $\Phi_{2,8}$ and $\Phi_{3,3}$ is 3*$\Delta t_1$ and the phase difference between $\Phi_{3,8}$ and $\Phi_{1,3}$ is 3*$\Delta t_1$.

As shown in FIG. 6, by the invention, the output end of the seventh MOSFET 605 is connected to the output end of the first MOSFET 608 and the output end of the eighth MOSFET 606 is connected to the output end of the second MOSFET 609, and as shown in FIG. 7, $\Phi_{1,7}$ is identical to $\Phi_{2,1}$, and $\Phi_{1,8}$ is identical to $\Phi_{2,2}$. Therefore, when $\Phi_{1,7}$ is at logic-HIGH, it causes the MOSFET 605 and the MOSFET 608 to be switched ON. When $\Phi_{1,8}$ is at logic-HIGH, it causes the MOSFET 606 and the MOSFET 609 to be switched ON. At the same time, the proper time for the MOSFET 607 to be turned from "ON" to "OFF" (which means $\Phi_{F1}$ is turned from logic-HIGH to logic-LOW) can be after the time when $\Phi_{1,6}$ is turned from logic-LOW to logic-HIGH and before the time when $\Phi_{2,3}$ is turned from logic-LOW to logic-HIGH, which is in a range of 3*$\Delta t_1$. At the same time when MOSFET 607 is switched from ON to OFF, MOSFET 614 is switched from OFF to ON (which means $\Phi_{F2}$ is turned from logic-LOW to logic-HIGH), therefore, the operating range of the MOSFET 614 can also be in a range of 3*$\Delta t_1$. When the $\Phi_{F2}$ is in a status of logic-HIGH (which means MOSFET 614 is switched ON), it allows cascaded MOSFETs (608, 609, . . . , 613) to be successively switched ON to sample the input serial data.

The operations of the sampling pulses ($\Phi_{1,1}$~$\Phi_{1,8}$, $\Phi_{F1}$) and ($\Phi_{3,1}$~$\Phi_{3,8}$, $\Phi_{F3}$) are similar to the operations of ($\Phi_{2,1}$~$\Phi_{2,8}$, $\Phi_{F2}$), so description thereof will not be repeated.

Therefore, when outputs of MOSFET 605 and MOSFET 608 are connected to each other, even the switching time when MOSFET 607 is switched from ON to OFF and when MOSFET 614 is switched from OFF to ON is shifted to the rising edge of the $\Phi_{1,7}$, it does not affect the continuity of signal driving capability. As the same as stated above, the switching time when MOSFET 614 is switched from ON to OFF is shifted to the rising edge of the $\Phi_{1,8}$, signals output from the MOSFET 606 and MOSFET 609 are continuously maintained. Therefore, the time when $\Phi_{F1}$ is turned from logic-HIGH to logic-LOW and $\Phi_{F2}$ is turned from logic-LOW to logic-HIGH can be arranged after the time when $\Phi_{1,6}$ is turned from logic-LOW to logic-HIGH and 3*$\Delta t_1$ before the time when $\Phi_{2,3}$ is turned from logic-LOW to logic-HIGH. By such arrangement, continuity of sampling pulses for driving MOSFET can be maintained. This allows the sampling pulse applied to the first stage of MOSFET circuit (as MOSFET 607) and the second stage of MOSFET circuit (as MOSFET 601) to have a greater error margin that allows the timing of the sampling pulses to be easier to realize than the prior art. Moreover, since the sampling pulses ($\Phi_{F1}$, $\Phi_{F2}$, $\Phi_{F3}$) applied to the first stage of MOSFET circuit will never be at logic-HIGH at the same time, there is no need to provide the loading of all the transmission gates; and therefore, the invention can help reduce the number of fan-outs of the oversampling circuit.

The oversampling circuit described in reference to FIG. 6 and FIG. 7 is only one exemplary preferred embodiment of the invention with N=2, M=2, and P=2. It is to be understood that the invention is not limited to this embodiment and the number of stages and the number of transmission gates can be various other numbers.

In conclusion, the invention provides an oversampling circuit and method which can help reduce the number of fan-outs. Moreover, the invention allows a greater error margin that allows the pulse generation and sequencing to be easier to realize than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An oversampling circuit for converting an input serial data stream into a parallel data format, which comprises:

an array of transmission gates arranged into N cascaded stages of main sampling circuits, each stage of main sampling circuit being composed of M parallel layers of sub-sampling circuits, where N, M are each an integer number; each transmission gate has an input end, an output end, and a control port; and the respective control ports of all the transmission gates are connected to a predefined sequence of sampling pulses;

wherein the transmission gates in the first stage of main sampling circuit are arranged in parallel and whose input ends are connected to receive the input serial data stream and whose output ends are each cascaded to one sub-sampling circuit in the next stage which is composed of a plurality of transmission gates arranged in parallel in a number equal to the number of bits in the parallel data format and whose input ends are connected together to the output end of the transmission gate in the previous stage of main sampling circuit;

and wherein in the next stage of main sampling circuits, at least one of the transmission gates in one layer of sub-sampling circuit has its output end connected to one of the transmission gates in the next layer of sub-sampling circuit; and at least one of the transmission gates in the last layer of sub-sampling circuit has its output end connected to one of the transmission gates in the first layer of sub-sampling circuit.

2. The oversampling circuit of claim 1, wherein N is equal to 2.

3. The oversampling circuit of claim 1, wherein each pair of the transmission gates in neighboring layers of sub-sampling circuits whose respective output ends are interconnected are switched ON when the sampling pulse applied thereto is switched to logic-HIGH.

4. The oversampling circuit of claim 1, wherein the transmission gates are each a MOSFET.

5. An oversampling circuit for converting an input serial data stream into a parallel data format, which comprises: an array of transmission gates arranged into N cascaded stages of main sampling circuits, each stage of main sampling circuit being composed of M parallel layers of sub-sampling circuits, where N, M are each an integer number; each transmission gate has an input end, an output end, and a control port; and the respective control ports of all the transmission gates are connected to a predefined sequence of sampling pulses;

wherein the transmission gates in the first stage of main sampling circuit are arranged in parallel and whose input ends are connected to receive the input serial data stream and whose output ends are each cascaded to one sub-sampling circuit in the next stage which is composed of a plurality of transmission gates arranged in parallel in a number equal to the number of bits in the parallel data format and whose input ends are connected together to the output end of the transmission gate in the previous stage of main sampling circuit;

and wherein in the next stage of main sampling circuits, at least one of the transmission gates in one layer of sub-sampling circuit has its output end connected to one of the transmission gates in the next layer of sub-sampling circuit; and at least one of the transmission gates in the last layer of sub-sampling circuit has its output end connected to one of the transmission gates in the first layer of sub-sampling circuit.

6. The oversampling circuit of claim 5, wherein N is equal to 2.

7. The oversampling circuit of claim 5, wherein each pair of the transmission gates in neighboring layers of sub-sampling circuits whose respective output ends are interconnected are switched ON when the sampling pulse applied thereto is switched to logic-HIGH.

8. The oversampling circuit of claim 5, wherein the transmission gates are each a MOSFET.

9. An oversampling method for use on an oversampling circuit to convert an input serial data stream into a parallel data format; the oversampling circuit being composed of an array of transmission gates arranged into N cascaded stages of main sampling circuits, each stage of main sampling circuit being composed of M parallel layers of sub-sampling circuits, where N, M are each an integer number; each transmission gate has an input end, an output end, and a control port;

the oversampling method comprising the steps of:

arranging the transmission gates in the first stage of main sampling circuit in parallel and whose input ends are connected to receive the input serial data stream and whose output ends are each connected to one sub-sampling circuit in the next stage which is composed of a plurality of transmission gates arranged in parallel in a number equal to the number of bits in the parallel data format and whose input ends are connected together to the output end of the transmission gate in the previous stage of main sampling circuit, connecting at least one of the output ends of the transmission gates in one layer of sub-sampling circuit to one of the output ends of the transmission gates in the next layer of sub-sampling circuit; and connecting at least one of the output ends of the transmission gates in the last layer of sub-sampling circuit to one of the output ends of the transmission gates in the first layer of sub-sampling circuit;

applying a predefined sequence of sampling pulses to the respective control ports of the transmission gates in each stage of main sampling circuit; and as one of the transmission gates in each stage of main sampling circuit is switched ON, applying a predefined sequence of sub-sampling pulses to the respective control ports of the transmission gates in the cascaded sub-sampling circuit.

10. The oversampling method of claim 9, wherein N is equal to 2.

11. The oversampling method of claim 9, wherein some of the main-sampling pulses applied to a neighboring main sampling circuit have overlapped periods.

12. The oversampling method of claim 9, wherein each pair of the transmission gates in neighboring layers of sub-sampling circuits whose respective output ends are interconnected are switched ON when the sampling pulse applied thereto is switched to logic-HIGH.

13. The oversampling method of claim 9, wherein the transmission gates are each a MOSFET.

* * * * *